United States Patent
Dietrich et al.

(10) Patent No.: US 10,651,742 B2
(45) Date of Patent: May 12, 2020

(54) DOWN-MODE VALLEY-CURRENT-SENSE REPLICA LINEARIZATION

(71) Applicant: Texas Instruments Incorporated, Dallas, TX (US)

(72) Inventors: Stefan Dietrich, Freising (DE); Joerg Kirchner, Mauern (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/292,750

(22) Filed: Mar. 5, 2019

(65) Prior Publication Data

US 2020/0076308 A1 Mar. 5, 2020

Related U.S. Application Data

(60) Provisional application No. 62/723,803, filed on Aug. 28, 2018.

(51) Int. Cl.
| | |
|---|---|
| *H02M 3/158* | (2006.01) |
| *H03K 5/24* | (2006.01) |
| *H03K 17/687* | (2006.01) |
| *H02M 1/00* | (2006.01) |

(52) U.S. Cl.
CPC ........... *H02M 3/1584* (2013.01); *H03K 5/24* (2013.01); *H03K 17/6871* (2013.01); *H02M 3/1582* (2013.01); *H02M 2001/0009* (2013.01)

(58) Field of Classification Search
CPC ................ H02M 2001/0009; H02M 3/1582
USPC .............. 323/277, 278, 285, 312, 315
See application file for complete search history.

(56) References Cited

U.S. PATENT DOCUMENTS

| | | | |
|---|---|---|---|
| 2004/0135556 A1* | 7/2004 | Kirchner | H02M 3/1582 323/225 |
| 2006/0097710 A1* | 5/2006 | Xi | H02M 3/156 323/282 |
| 2007/0019450 A1* | 1/2007 | Tiew | H02M 3/156 363/98 |
| 2017/0040892 A1* | 2/2017 | Rutkowski | H02M 3/158 |

\* cited by examiner

*Primary Examiner* — Gary A Nash
(74) *Attorney, Agent, or Firm* — Lawrence J. Bassuk; Charles A. Brill; Frank D. Cimino (57) ABSTRACT

A current measurement linearization circuit for a DC/DC boost converter includes a back-gate sensing transistor and a back-gate reset transistor. The back-gate sensing transistor has a first terminal coupled to a first body contact of a high-side power transistor and a second terminal coupled to a second body contact of a first replica transistor in a valley-current sensing circuit. The back-gate reset transistor has a first terminal coupled to a max reference voltage that is equal to the greater of an input voltage and an output voltage and a second terminal coupled to the second body contact.

19 Claims, 7 Drawing Sheets

DOWN-MODE VALLEY-CURRENT-SENSE REPLICA LINEARIZATION

PRIORITY UNDER 35 U.S.C. § 119(e) & 37 C.F.R. § 1.78

This non-provisional application claims priority based upon the following prior United States provisional patent application(s): (i) "Down-Mode Valley-Current-Sense Replica Linearization," Application No. 62/723,803, filed Aug. 28, 2018, in the name(s) of Stefan Dietrich and Joerg Kirchner, which is hereby incorporated by reference in its entirety.

FIELD OF THE DISCLOSURE

Disclosed embodiments relate generally to the field of power circuits. More particularly, and not by way of any limitation, the present disclosure is directed to down-mode valley-current-sense replica linearization.

SUMMARY

Disclosed embodiments provide a current measurement linearization circuit for valley-current-controlled boost converters in down-mode operation. During down-mode, the current measurement linearization circuit isolates the back-gate of a replica transistor from capacitive coupling between the switch-node and the sense-node and allows resetting of a replicated voltage. The current measurement linearization circuit can provide higher current sense accuracy in down-mode, which may increase the boost-mode to down-mode line transition performance.

In one aspect, an embodiment of a current measurement linearization circuit for a DC/DC boost converter is disclosed. The current measurement linearization circuit includes a back-gate sensing transistor having a first terminal coupled to a first body contact of a high-side power transistor and a second terminal coupled to a second body contact of a first replica transistor in a valley-current sensing circuit; and a back-gate reset transistor having a first terminal coupled to a max reference voltage that is equal to the greater of an input voltage and an output voltage and a second terminal coupled to the second body contact.

In another aspect, an embodiment of a DC/DC boost converter implemented on an integrated circuit (IC) chip is disclosed. The DC/DC boost converter includes a low-side power transistor coupled in series with a high-side power transistor between a first pin and a second pin, a switch-node between the low-side power transistor and the high-side power transistor being coupled to a third pin; a back-gate disconnect transistor coupled between a first body contact of the high-side power transistor and the second pin; a valley-current sensing circuit comprising a first replica transistor that is coupled in series with a first current sink between the switch-node and a lower rail, a node between the first replica transistor and the first current sink being coupled to provide a replicated voltage to an inverting input of a comparator, and a second replica transistor that is coupled in series with a second current sink between a max reference voltage and the lower rail, a node between the second replica transistor and the second current sink being coupled to provide a comparison voltage on a non-inverting input of the comparator; and a current measurement linearization circuit comprising a back-gate sensing transistor that is coupled between the first body contact and a second body contact of the first replica transistor and a back-gate reset transistor that is coupled between the second body contact and a max reference voltage.

In another aspect, an embodiment of a method of operating a DC/DC boost converter is disclosed. The method includes providing the DC/DC boost converter implemented in an integrated circuit chip, the DC/DC boost converter comprising a high-side power transistor that is a P-type metal oxide silicon (PMOS) transistor, the DC/DC boost converter being coupled to utilize valley-current control to provide an output voltage; coupling a first pin to a ground plane; coupling a second pin to an output capacitor and to a load; and coupling a third pin to an input voltage through an inductor, the inductor being thereby coupled to the high-side power transistor and to a first replica transistor; wherein the DC/DC boost converter is coupled, during a boost-mode, to connect a first body contact of the high-side power transistor and a second body contact of the first replica transistor together and is further coupled, during a down-mode when the low-side power transistor is off, to connect the first body contact and the second body contact together and during the down-mode when the low-side power transistor is on, to disconnect the first body contact and the second body contact and to couple the second body contact to a max reference voltage that is equal to a larger one of an input voltage and an output voltage.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Modern boost converters operating at very large duty cycles can support two operating modes. Boost-mode operation occurs during steady-state operation when the output voltage Vout is greater than input voltage Vin. Down-mode operation occurs much less often but is used during start-up or in special steady-state applications where output voltage Vout is less than input voltage Vin.

Figure 4:
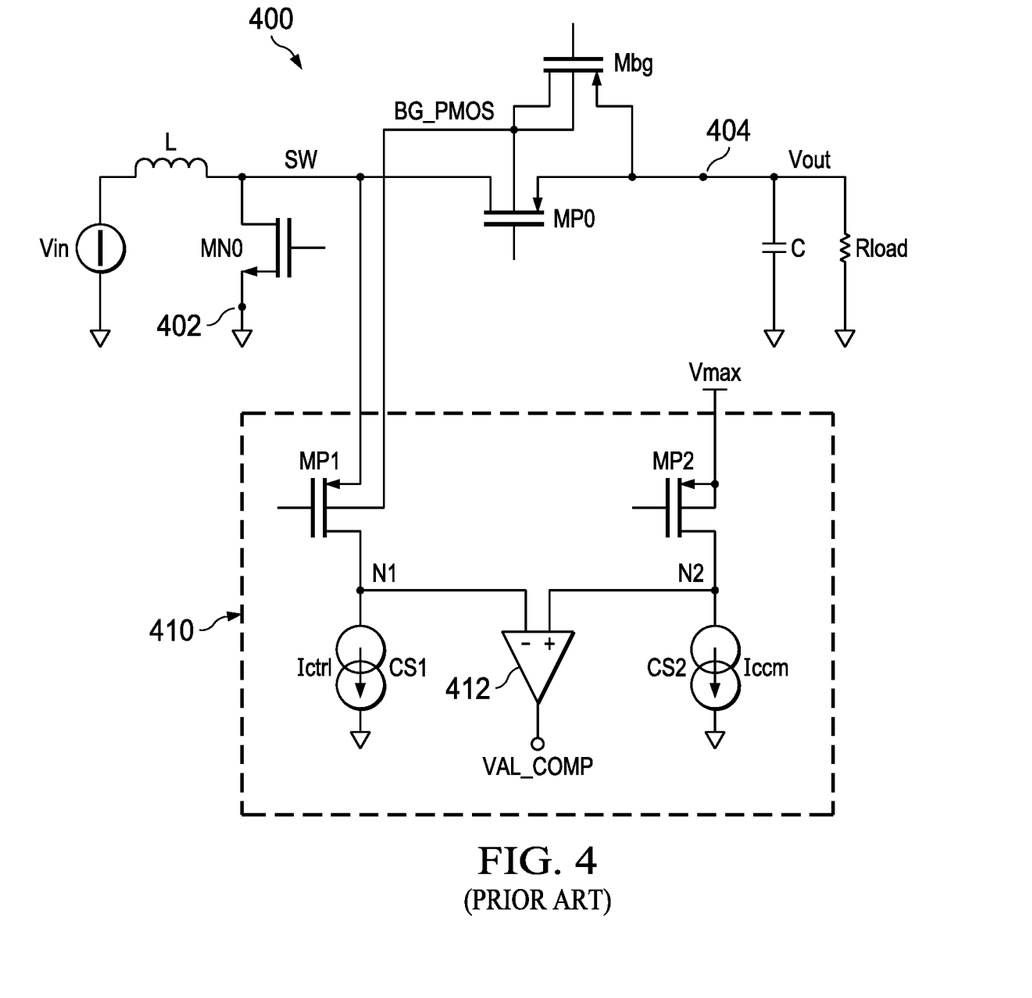
FIG. 4 depicts an example DC/DC boost converter with valley current sensing according to the prior art.

FIG. 4 depicts a DC/DC boost converter 400 having a low-side power transistor MN0, which is an N-type metal oxide silicon (NMOS) transistor, coupled in series with a high-side power transistor MP0, which is a P-type metal oxide silicon (PMOS) transistor, between a ground node 402 and an output node 404. Ground node 402 is coupled to the lower rail, e.g., a ground plane, and output node 404 is coupled to provide output voltage Vout. Input voltage Vin is coupled to an inductor L, which is also coupled to a switch-node SW that lies between low-side power transistor MN0 and high-side power transistor MP0. Capacitor C is generally an external capacitor and resistor Rload represents the load on DC/DC boost converter 400.

Also shown is a back-gate disconnect transistor Mbg, which is coupled between the back-gate (also known as the body contact) of high-side power transistor MP0 and output node 404 that provides output voltage Vout. The body contact of back-gate disconnect transistor Mbg is also coupled to the body contact of high-side power transistor MP0. Circuit 410 is designed to measure the valley current through high-side power transistor MP0 and includes a first replica transistor MP1, a second replica transistor MP2, a comparator 412, a first current sink CS1 that sinks an error amplifier control current Ictrl, and a second current sink CS2 that sinks a constant reference current Iccm. First replica transistor MP1 is coupled in series with first current sink CS1 between switch-node SW and the lower rail, with a replicated voltage N1, taken from a point between first replica transistor MP1 and first current sink CS1 being provided to the inverting input of comparator 412. Similarly, second replica transistor MP2 is coupled in series with second current sink CS2 between max reference voltage Vmax and the lower rail, with a comparison voltage N2 taken from a point between second replica transistor MP2 and second current sink CS2 being provided to the non-inverting input of comparator 412.

First replica transistor MP1 is a much small version of high-side power transistor MP0. In one embodiment, high-side power transistor MP0 is a very large switch and first replica transistor MP1 is ten thousand times smaller, with consequently ten thousand times greater resistance across the gate. First current sink CS1 is controlled so that the current 'I' times the drain/source on-resistance Rds,on for high-side power transistor MP0 is equal to the current times the drain/source on-resistance for replica transistor MP1, i.e., $$I_{MP0} \times R_{ds,on,MP0} = I_{MP1} \times R_{ds,on,MP1} \qquad \text{Equation 1}$$

This relationship sets a value for replicated voltage N1 that can be used to determine the current through high-side power transistor MP0.

When DC/DC boost converter 400 is operating in boost-mode, low-side power transistor MN0 and high-side power transistor MP0 are turned on and off in anti-phase, with a duty cycle that is determined based on input voltage Vin and output voltage Vout. When valley-current-control is implemented, circuit 410 senses the high-side transistor current and compares the high-side transistor current to a reference current. As soon as the sensed valley-current is equal to the reference current, the high-side power transistor MP0 is turned off and the low-side power transistor MN0 is turned on. Low-side power transistor MN0 remains on until either a clock signal (e.g., in a constant frequency system) or a timer (e.g., in a constant on-time system) provides a trigger to turn the low-side off and the high-side on again.

During boost-mode, low-side power transistor MN0 and high-side power transistor MP0 are driven in linear mode when turned on to act as switches. However, when DC/DC boost converter 400 is operating in down-mode, high-side power transistor MP0 cannot operate in linear mode when turned on because output voltage Vout is less than input voltage Vin. This means that the voltage across the inductor L in the discharge phase, i.e., when high-side power transistor MP0 is on, is still positive and the inductor current is increasing.

To allow inductor current regulation in down-mode, the high-side power transistor MP0 is put in a special operation mode in which the gate of high-side power transistor MP0 is connected to input voltage Vin and the body contact BG_PMOS is disconnected from output node 404 and therefore from output voltage Vout. The disconnection of body contact BG_PMOS from output node 404 is necessary to avoid back-gate current flow. Because output voltage Vout is not the highest potential present in the down-mode, connecting input voltage Vin at switch-node SW would result in back-gate current flow through high-side power transistor MP0 such that high-side power transistor MP0 no longer provided isolation. Back-gate disconnect transistor Mbg is turned off to disconnect the body contact BG_PMOS+ of the high-side power transistor MP0 from output voltage Vout.

In order to disconnect body contact BG_PMOS from output voltage Vout in down-mode, the gate of back-gate disconnect transistor Mbg is tied to input voltage Vin. When body contact BG_PMOS is disconnected from output node 404 and the gate of high-side power transistor MP0 is connected to input voltage Vin, high-side power transistor MP0 acts as a passive diode rather than as a switch.

When current is flowing from switch-node SW to output node 404, the switch-node voltage Vsw will increase to a value that is VThigh-side above input voltage Vin, where VThigh-side is the threshold voltage of the high-side power transistor MP0, at which point the high-side power transistor MP0 starts to conduct current. In order to have a seamless transition without disturbances on output voltage Vout between boost-mode, in which output voltage Vout is greater than input voltage Vin, and down-mode, in which output voltage Vout is less that input voltage Vin, a current sensing circuit is required that can handle the two modes.

Circuit 410 is a typical replica-transistor-based valley-current-control sensing circuit that operates in both boost-mode and down-mode. When current flows across high-side power transistor MP0 from switch-node SW to output node 404, the current generates a voltage drop that is proportional to a respective drain/source on-resistance Rds,on multiplied by the load current. With first replica switch MP1 connected to switch-node SW and the error amplifier control current Ictrl, the voltage drop across first replica transistor MP1 matches the voltage drop across high-side power transistor MP0 divided by the replica factor and produces replicated voltage N1. Once the value of replicated voltage N1 drops below comparison voltage N2, the current across high-side power transistor MP0 has dropped below the required valley-current and comparator 412 provides a high value on valley current comparison signal VAL_COMP, which turns on low-side power transistor MN0.

In order to be able to sense negative valley currents, second replica transistor MP2 is used to generate an offset voltage in combination with the constant reference current Iccm. The second replica transistor MP2 is coupled to max reference voltage Vmax, which is the higher voltage of output voltage Vout and input voltage Vin. In boost-mode, max reference voltage Vmax is equal to output voltage Vout, whereas in down-mode, max reference voltage Vmax is equal to input voltage Vin. Constant reference current Iccm and the drain/source on-resistance Rds,on of second replica transistor MP2 generate the comparison voltage N2, which is typically set to match with a zero load current across high-side power transistor MP0. If error amplifier control current Ictrl is greater than constant reference current Iccm, DC/DC boost converter 400 regulates to positive valley-currents across high-side power transistor MP0. For an error amplifier control current Ictrl less than constant reference current Iccm, DC/DC boost converter 400 regulates to negative valley-currents and if error amplifier control current Ictrl is equal to constant reference current Iccm, DC/DC boost converter 400 regulates to zero valley-current. Whereas in boost-mode, comparison voltage N2 is approximately equal to output voltage Vout, in down-mode comparison voltage N2 is approximately equal to input voltage Vin, because max reference voltage Vmax is equal to input voltage Vin, which in down-mode is greater than output voltage Vout.

The first replica transistor MP1 is kept in the same operation mode as the high-side power transistor MP0. Accordingly, when high-side power transistor MP0 is in boost-mode, first replica transistor MP1 is also in boost-mode and when high-side power transistor MP0 is in down-mode, first replica transistor MP1 is in down-mode. As a result, the body contact of first replica transistor MP1 also needs to be disconnected from output voltage Vout in down-mode operation. As shown in FIG. 4, the body contact of first replica transistor MP1 is coupled to both the drain and the body contact of high-side power transistor MP0.

Figure 5A:
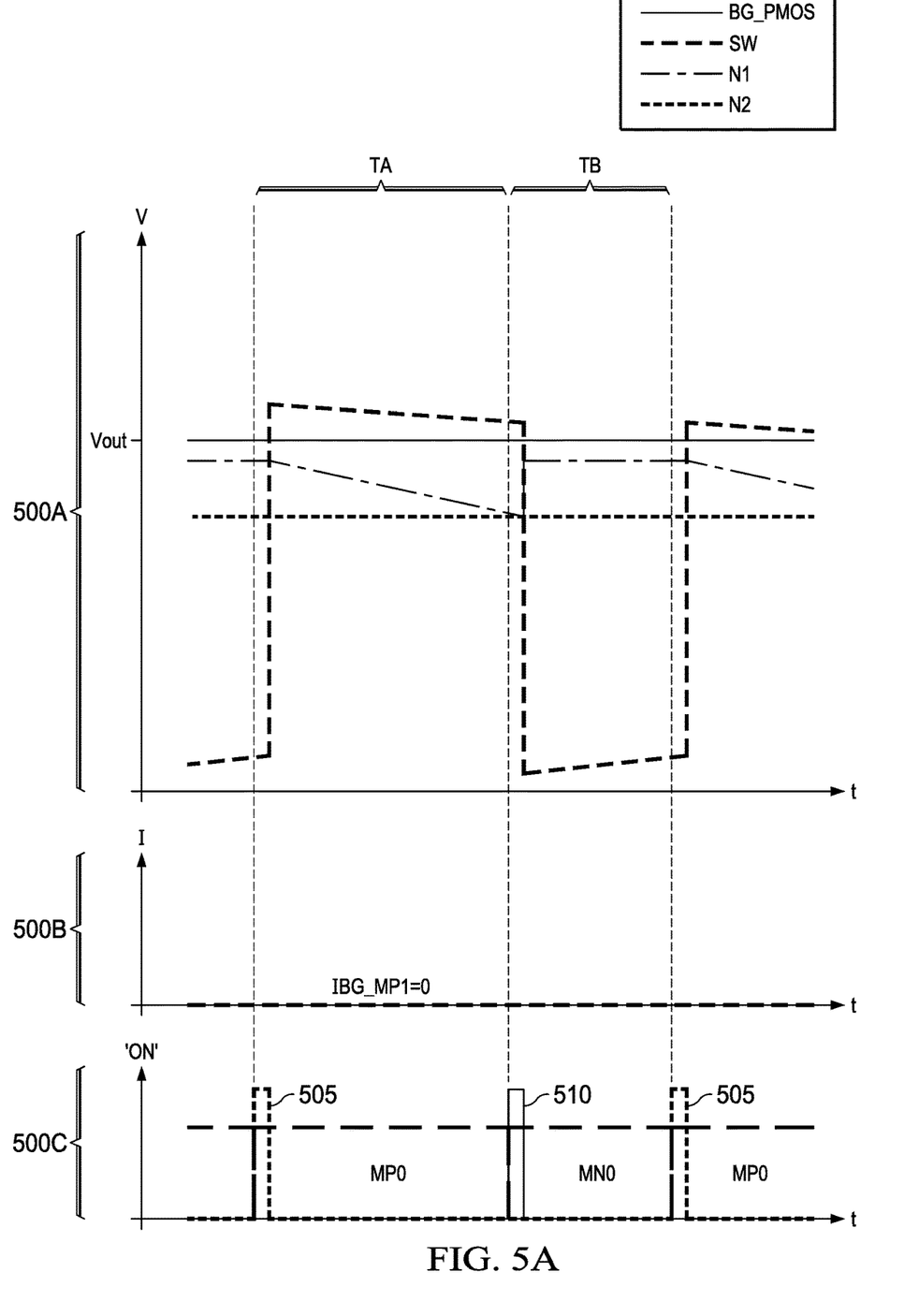
FIG. 5A depicts various voltage and current values on the DC/DC boost converter of FIG. 4 during boost-mode.
Figure 5B:
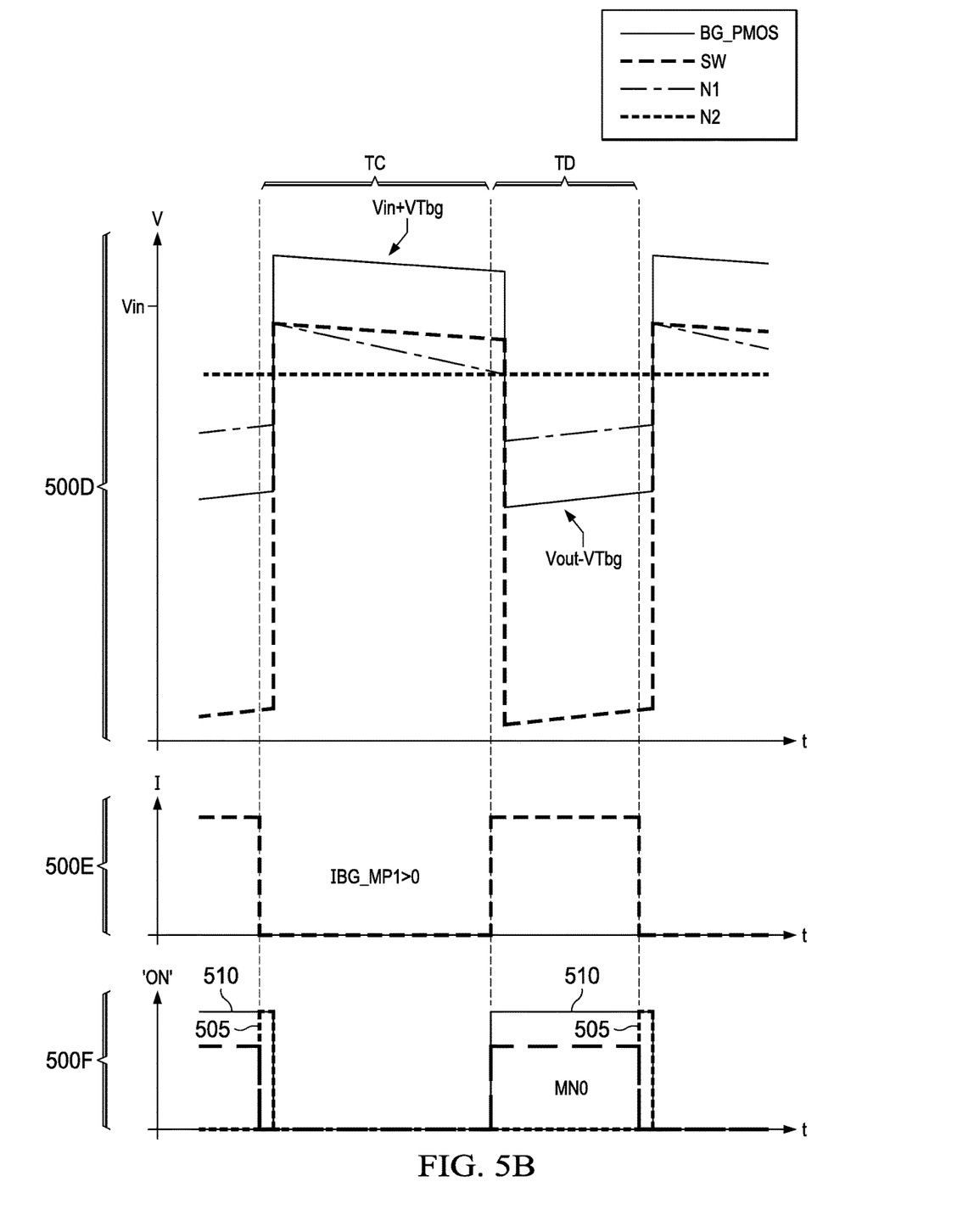
FIG. 5B depicts various voltage and current values on the DC/DC boost converter of FIG. 4 during down-mode, as well as a potential problem the disclosure addresses.

FIG. 5A depicts a number of graphs showing voltage and current values for the DC/DC boost converter 400 during boost-mode, while FIG. 5B depicts the graphs with the same voltage and current values during down-mode and shows a problem related to the disconnected and high-impedance body contact BG_PMOS during down-mode operation of the prior-art solution. Graph 500A depicts the voltage waveforms on switch-node SW, body contact BG_PMOS, replicated voltage N1 and comparison voltage N2 during boost-mode operation. During the same time period, graph 500B depicts a back-gate current IBG,MP1 across first replica transistor MP1, which is equal to zero, and graph 500C depicts the times when each of high-side power transistor MP0 and low-side power transistor MN0 are turned on, the clock/timer signal 505 to turn on high-side power transistor MP0 and the valley-current comparison signal VAL_COMP 510 that turns on low-side power transistor MN0.

When the high-side power transistor MP0 in boost-mode is on during time period TA, graph 500A illustrates that the voltage on switch-node SW is greater than output voltage Vout for a positive load current across high-side power transistor MP0. The body contact BG_PMOS is connected to output voltage Vout, which is the highest potential in the circuit and therefore the same as max reference voltage Vmax. Comparison voltage N2 is constant and smaller than output voltage Vout. The replicated voltage N1 declines during the current measurement phase in time period TA. As soon as replicated voltage N1 is equal to comparison voltage N2, a high value is provided on valley-current comparison signal VAL_COMP 510 (graph 500C), which turns on low-side power transistor MN0 for time period TB. The replicated voltage N1 (graph 500A) is reset to about the value of output voltage Vout during the on phase for low-side power transistor MN0 in time period TB so that no false trigger of the valley-current comparison signal VAL_COMP 510 occurs. After a certain on-time of low-side power transistor MN0 (for constant-time-on converters) or at the converter clock (for fixed-frequency converters), a high value on the clock/timer signal 505 (graph 500C) causes the low-side power transistor MN0 to be turned off and high-side power transistor MP0 to be turned on again. During boost-mode, back-gate current IBG,MP1 (graph 500B) across first replica transistor MP1 remains at zero.

When the converter is in down-mode, as shown in FIG. 5B, the gate of high-side power transistor MP0 is connected to input voltage Vin, the body contact BG_PMOS is disconnected from output voltage Vout and thus floating, and the high-side power transistor MP0 behaves as a passive diode. However, the sharing of disconnected body contact BG_PMOS by first replica transistor MP1 can result in several issues for current sensing during down-mode. During time period TC after low-side power transistor MN0 is turned off (graph 500F), the voltage on switch-node SW rises to about input voltage Vin, then slowly drops (graph 500D). The voltage on body contact BG_PMOS rises to a value equal to input voltage Vin plus threshold voltage VTbg, where VTbg is the threshold voltage of the back-gate disconnect transistor Mbg of DC/DC boost converter 400. Comparison voltage N2 has a constant value that is less than input voltage Vin and replicated voltage N1 is initially set to a value equal to the voltage on switch-node SW, but decreases more quickly than does switch-node SW until replicated voltage N1 equals comparison voltage N2 and triggers turning on of valley-current comparison signal VAL_COMP 510.

When the low-side power transistor MN0 is enabled in time period TD, switch-node SW is pulled to ground as seen in graph 500D and body contact BG_PMOS is pulled to a value of Vout−VTbg. Due to the connection of both high-side power transistor MP0 and first replica transistor MP1 to switch-node SW, the high-impedance body contact BG_PMOS suffers from capacitive coupling introduced by switch-node SW. While the low-side power transistor MN0 is on, replicated voltage N1 is typically reset to a potential that is higher than comparison voltage N2, as shown in graph 500A for boost-mode. This resetting is performed by connecting first replica transistor MP1 to max reference voltage Vmax, which is not specifically shown in FIG. 4, and is done to prevent the comparator 412 from triggering a false valley-current comparison signal VAL_COMP. However, when body contact BG_PMOS equals (Vout−VTbg), replicated voltage N1 discharges across the back-gate of first replica transistor MP1 towards back-gate disconnect transistor Mbg with a non-zero static back-gate current IBG,MP1 (graph 500E), whereas comparison voltage N2 remains constant at about input voltage Vin, which is the value of max reference voltage Vmax during down-mode. The parasitic discharge of replicated voltage N1 to a value far below the value of comparison voltage N2, which is approximately equal to input voltage Vin in down-mode, has several drawbacks. As soon as the low-side power transistor MN0 is disabled, comparator 412 is used to measure the valley-current. Because replicated voltage N1 has been parasitically discharged, the comparator may trigger a false high-value on valley current comparison signal VAL_COMP 510 (graph 500F) and the converter control may generate a glitch to turn the low-side power transistor MN0 on again. In a worst case, this can result in higher frequency operation with an inability to maintain stable operation. A second drawback is the static back-gate current IBG,MP1 across first replica transistor MP1.

As soon as low-side power transistor MN0 is disabled at the end of time period TD, the voltage on switch-node SW floats to the value (Vin+VThigh-side) so that the high-side power transistor MP0 starts to conduct as a passive diode. While switch-node SW increases, the voltage on body contact BG_PMOS also increases to the value (Vin+VTbg) until the back-gate disconnect transistor Mbg is forward-biased. The potential on body contact BG_PMOS is now the highest potential again, so that the back-gate current IBG, MP1 across first replica transistor MP1 is stopped, allowing replicated voltage N1 to rise to normal values.

Figure 1:
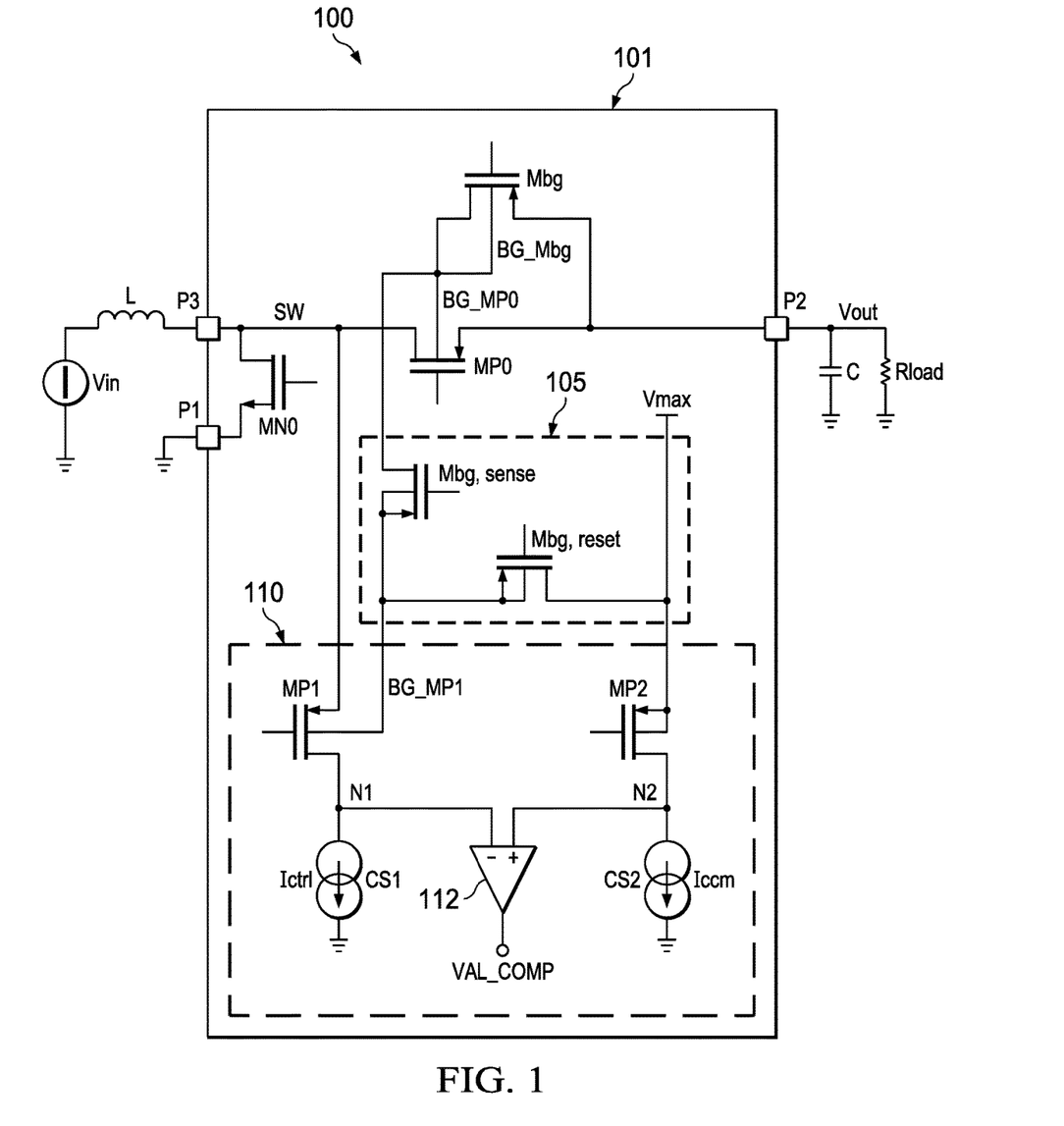
FIG. 1 depicts an example of a DC/DC boost converter according to an embodiment of the disclosure.

Having looked at the problem that may occur in DC/DC boost converter 400, we now turn to FIG. 1, which provides a solution. FIG. 1 depicts an example of a DC/DC boost converter 100 that is implemented in an integrated circuit chip 101 according to an embodiment of the disclosure. In DC/DC boost converter 100, low-side power transistor MN0 is coupled in series with high-side power transistor MP0 between a first pin P1 and a second pin P2. Switch-node SW, which lies between low-side power transistor MN0 and high-side power transistor MP0, is coupled to a third pin P3. During operation of DC/DC boost converter 100, first pin P1 is coupled to a lower rail, which can be a ground plane; second pin P2 is coupled to a first node of capacitor C and to a load shown as resistor Rload; and third pin P3 is coupled to an input voltage through an inductor L. Because the connections between various body contacts is relevant to the present disclosure, the individual body contacts are separately referred to by their respective transistor as follows: high-side power transistor MP0 has first body contact BG_MP0, first replica transistor MP1 has second body contact BG_MP1 and back-gate disconnect transistor Mbg has third body contact BG_Mbg. Back-gate disconnect transistor Mbg is coupled between the first body contact BG_MP0 and the second pin in order to decouple first body contact BG_MP0 from output voltage Vout as necessary. Third body contact BG_Mbg is coupled first body contact BG_MP0.

Valley-current sensing circuit 110 includes first replica transistor MP1 coupled in series with first current sink CS1 between switch-node SW and the lower rail. First current sink CS1 passes an error amplifier control current Ictrl. Replicated voltage N1 is taken from a point between first replica transistor MP1 and first current sink CS1 and is provided to the inverting input of comparator 112. Second replica transistor MP2 is coupled in series with second current sink CS2 between max reference voltage Vmax and the lower rail, where max reference voltage Vmax is equal to the higher of input voltage Vin and output voltage Vout. Comparison voltage N2 is taken from a point between second replica transistor MP2 and second current sink CS2 and is provided to the non-inverting input of comparator 112. Comparator 112 provides a valley-current comparison signal VAL_COMP that can be used to initiate turning on of low-side power transistor MN0 and may also be used to initiate turning off of high-side power transistor MP0 when high-side power transistor MP0 is operating as a switch.

A new current measurement linearization circuit 105 has been added to DC/DC boost converter 100 and includes two new transistors. A back-gate sensing transistor Mbg,sense has a first terminal coupled to first body contact BG_MP0 and to third body contact BG_Mbg and a second terminal coupled to second body contact BG_MP1. Back-gate sensing transistor Mbg,sense is able to isolate second body contact BG_MP1 from first body contact BG_MP0 and third body contact BG_Mbg. Back-gate reset transistor Mbg,reset is coupled between max reference voltage Vmax and second body contact BG_MP1.

Back-gate sensing transistor Mbg,sense and back-gate reset transistor Mbg,reset are controlled to separate first body contact BG_MP0 and third body contact BG-Mbg from second body contact BG_MP1 when low-side power transistor MN0 is active. Whereas during down-mode, first body contact BG_MP0 still floats to (Vout−VTbg) when the low-side power transistor MN0 is enabled and to (Vin+VTbg) when the low-side power transistor MN0 is disabled, second body contact BG_MP1 is tied to first body contact BG_MP0 only when low-side power transistor MN0 is inactive and is tied to max reference voltage Vmax when low-side power transistor MN0 is active.

During the on phase for low-side power transistor MN0 when first body contact BG_MP0 drops to (Vout−VTbg), back-gate reset transistor Mbg,reset is also on to connect second body contact BG_MP1 to the max reference voltage Vmax. In this same period, back-gate sensing transistor Mbg,sense is off. Tying the second body contact BG_MP1 to max reference voltage Vmax avoids any discharge of the replicated voltage N1 towards first body contact BG_MP0, because max reference voltage Vmax is greater than replicated voltage N1 and the body diode of first replica transistor MP1 is not forward-biased. This feature improves the prior-art sampling method shown in FIG. 5B, in which there may occur a parasitic discharge of replicated voltage N1.

When the low-side power transistor MN0 is off and first body contact BG_MP0 floats to (Vin+VTbg), back-gate sensing transistor Mbg,sense is turned on to connect second body contact BG_MP1 to first body contact BG_MP0 in order to have the same body potentials for high-side power transistor MP0 and corresponding replica transistor MP1. This body connection during the current regulation phase enables an accurate current regulation and no mismatch between high-side power transistor MP0 and replica transistor MP1. During this period back-gate reset transistor Mbg,reset is turned off.

Figure 2A:
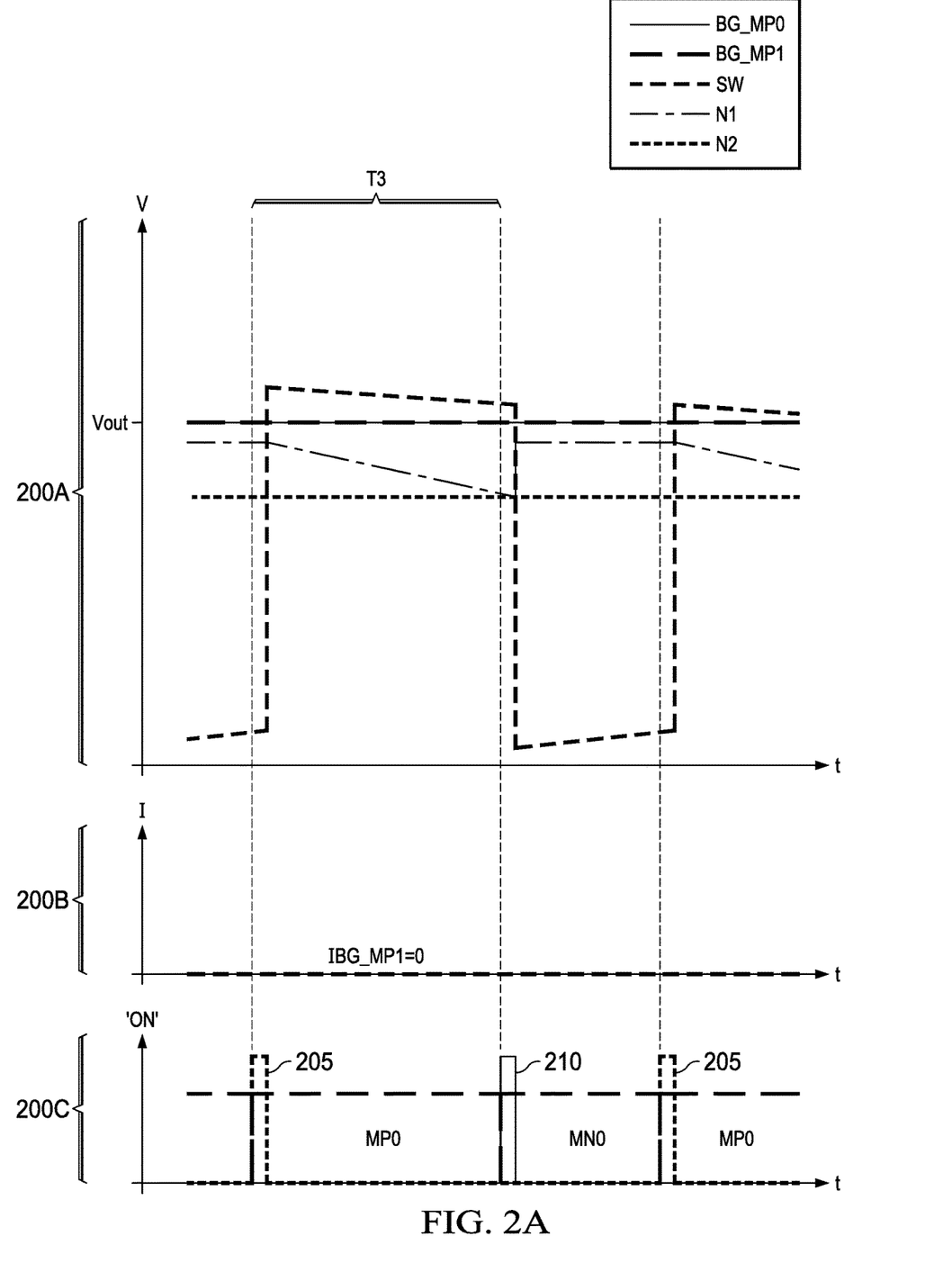
FIG. 2A depicts various voltage and current values on the DC/DC boost converter of FIG. 1 during boost-mode according to an embodiment of the disclosure.
Figure 2B:
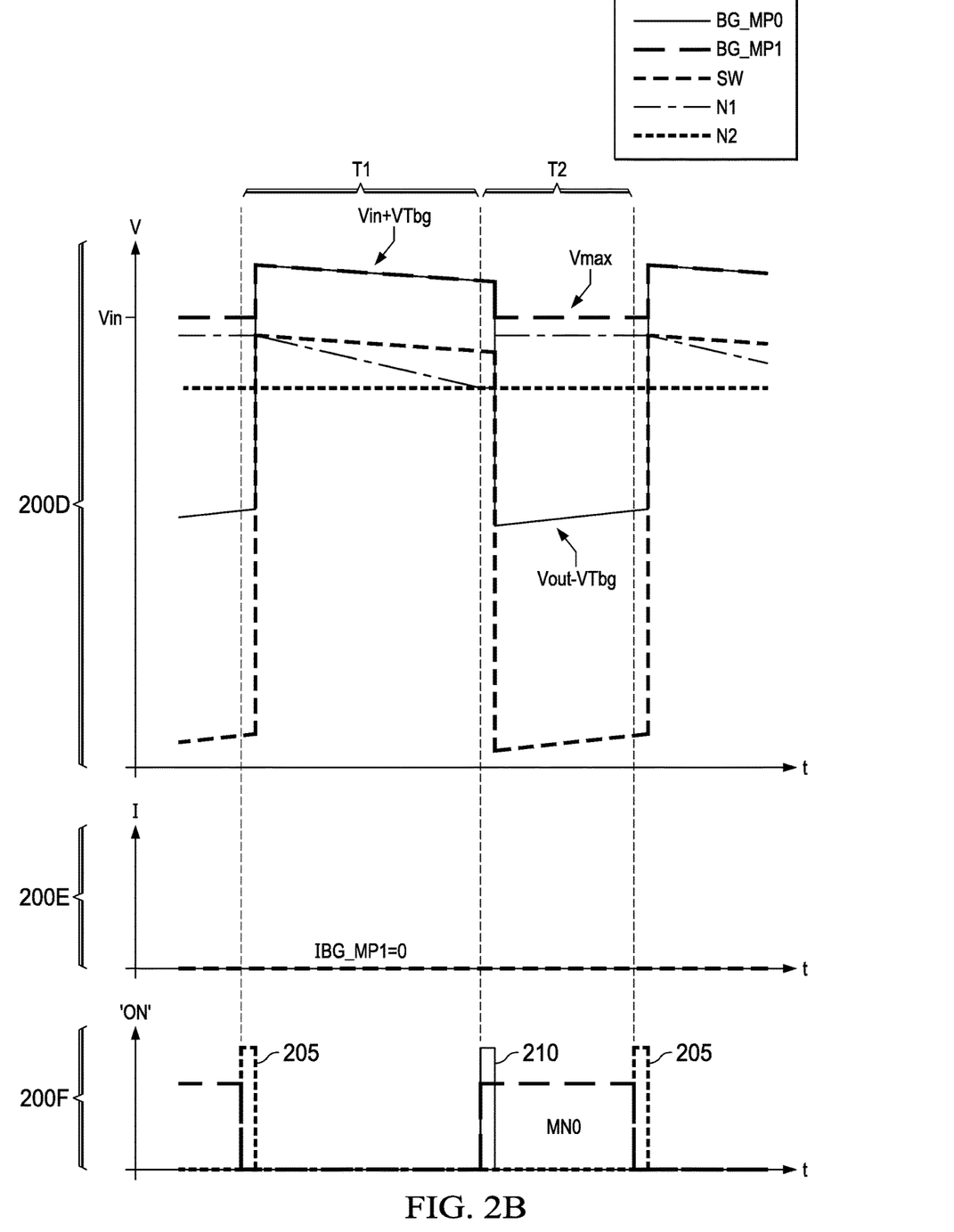
FIG. 2B depicts various voltage and current values on the DC/DC boost converter of FIG. 1 during down-mode according to an embodiment of the disclosure.

The waveforms associated with DC/DC boost converter 100 are shown in FIGS. 2A and 2B, in which graphs 200A, 200B and 200C depict waveforms during boost-mode and graphs 200D, 200E and 200F depict waveforms during down-mode. During boost-mode, first body contact BG_MP0 is connected to output voltage Vout and the back-gate sensing transistor Mbg,sense is turned on. This means that, as shown in graph 200A, the voltage on second body contact BG_MP1 is equal to the voltage on first body contact BG_MP0, such that the operations are the same as in FIG. 5A. It can be seen that there is no back-gate current IBG,MP1 across first replica transistor MP1, as shown in graph 200B, and both clock/timer signal 205 and valley-current comparison signal VAL_COMP 210 are operating similarly to FIG. 5A, as shown in graph 200C.

However, in down-mode, back-gate sensing transistor Mbg,sense is used to couple second body contact BG-MP1 to first body contact BG_MP0 only during a first time period T1 when low-side power transistor MN0 is turned off. During a second time period T2 when low-side power transistor MN0 is turned on, back-gate reset transistor Mbg, reset turns on and couples second body contact BG-MP1 to max reference voltage Vmax. The switching of back-gate sensing transistor Mbg,sense and back-gate reset transistor Mbg,reset thus generates an updated voltage on second body contact BG_MP1, which is divided into two parts and controlled by the switching period of low-side power transistor MN0.

The connection of first body contact BG_MP0 to second body contact BG_MP1 is crucial for accurate valley-current sensing using replicated voltage N1 and comparison voltage N2. During the current-sensing period in the inductor discharge phase, e.g., first time period T1 and third time period T3, first replica transistor MP1 must match high-side power transistor MP0, as seen in graph 200D, because any difference in the first body contact BG_MP0 and second body contact BG_MP1 creates a static error and degrades performance during transitions between boost-mode and down-mode.

When low-side power transistor MN0 is enabled in second time period T2, first body contact BG_MP0 is equal to (Vout−VTbg) and back-gate reset transistor Mbg,reset is turned on to couple second body contact BG_MP1 to max reference voltage Vmax. The resulting voltage on second body contact BG_MP1 prevents a parasitic discharge across first replica transistor MP1 and back-gate disconnect transistor Mbg and means that replicated voltage N1 does not drop below the potential of comparison voltage N2. This defined reset of replicated voltage N1 with respect to comparison voltage N2 avoids a false triggering of the valley-current-comparator, as shown in graph 200F, and also avoids a static current flow from replicated voltage N1 through the first replica transistor MP1 and back-gate sensing transistor Mbg,sense towards back-gate disconnect transistor Mbg, as shown in graph 200E. As soon as low-side power transistor MN0 turns off, switch-node SW increases and due to capacitive coupling, the voltage at first body contact BG_MP0 is increased to (Vin+VTbg). Because (Vin+VTbg) is process and temperature dependent, second body contact BG_MP1 needs to follow first body contact BG_MP0, which is accomplished by coupling through back-gate sensing transistor Mbg,sense.

Figure 3:
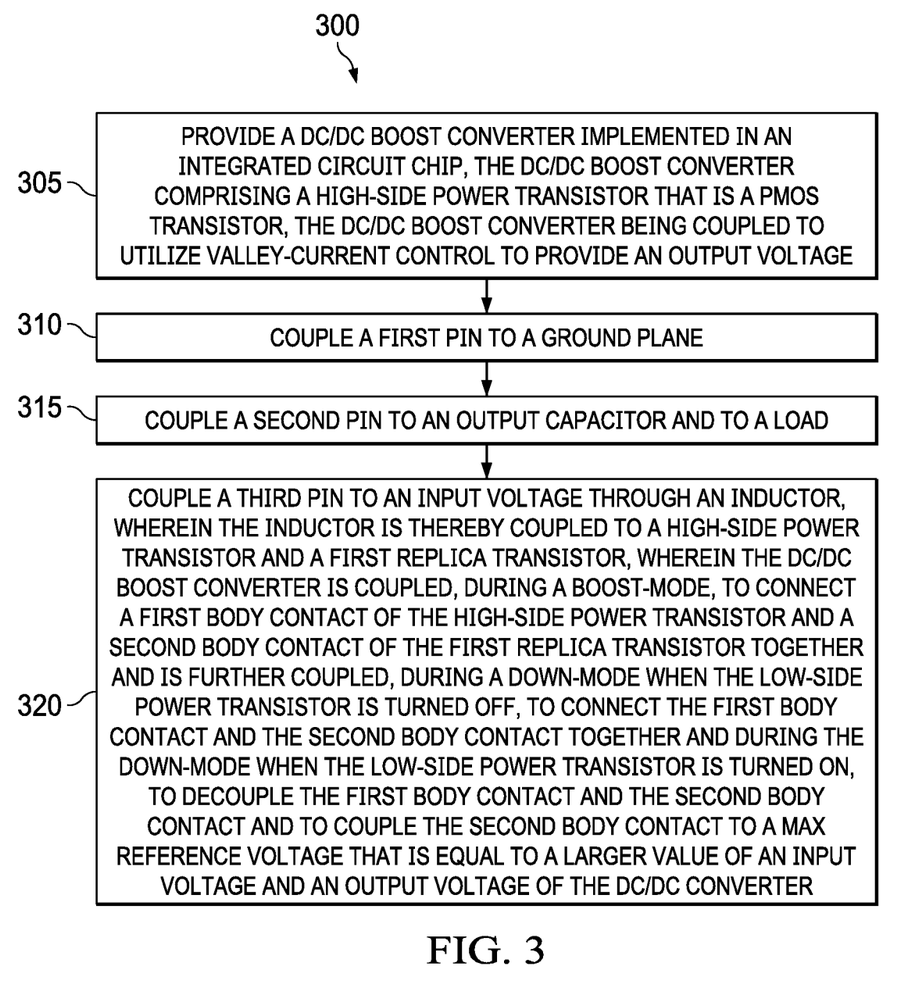
FIG. 3 depicts a flowchart of a method of operating a DC/DC boost converter implemented on an IC chip according to an embodiment of the disclosure.

FIG. 3 depicts a flowchart of a method 300 of operating a DC/DC boost converter implemented in an integrated circuit chip. Method 300 begins with providing 305 a DC/DC boost converter implemented in an integrated circuit chip. The DC/DC boost converter comprises a high-side power transistor that is a PMOS transistor and is coupled to utilize valley-current control to provide an output voltage. The method continues with coupling 310 a first pin to a ground plane; coupling 315 a second pin to an output capacitor and to a load; and coupling 320 a third pin to an input voltage through an inductor, wherein the inductor is thereby coupled to a high-side power transistor and a first replica transistor. The DC/DC boost converter is coupled, during a boost-mode, to connect a first body contact of the high-side power transistor and a second body contact of the first replica transistor together and is further coupled, during a down-mode when the low-side power transistor is turned off, to connect the first body contact and the second body contact together. During the down-mode when the low-side power transistor is turned on, the DC/DC boost converter is coupled to decouple the first body contact and the second body contact and to couple the second body contact to a max reference voltage that is equal to a larger value of an input voltage and an output voltage of the DC/DC converter.

Figure 3A:
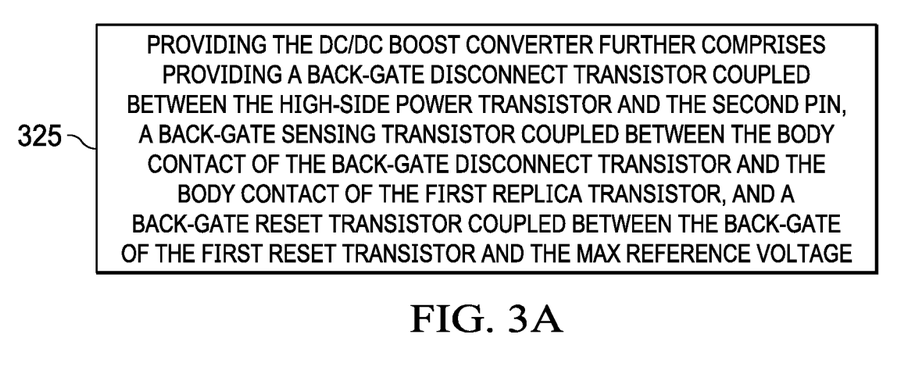

FIG. 3A provides further clarification of element 305 and continues that providing the DC/DC boost converter further comprises providing 325 a back-gate disconnect transistor coupled between the high-side power transistor and the second pin, a back-gate sensing transistor coupled between the body contact of the back-gate disconnect transistor and the body contact of the first replica transistor, and a back-gate reset transistor coupled between the back-gate of the first reset transistor and the max reference voltage.

Applicants have disclosed a DC/DC boost converter that contains a current measurement linearization circuit to isolate a first body contact of a high-side power transistor from a second body contact of a replica transistor during a time period when the boost converter is in down-mode and the low-side power transistor is active. While the second body contact is isolated from the first body contact, the second body contact is coupled to the max reference voltage Vmax, which is the greater of input voltage Vin and output voltage Vout. The current measurement linearization circuit can prevent a back-gate current across the replica transistor that may interfere in stable operation of the boost converter. Applicants have also disclosed a method of operating a DC/DC boost converter. Higher current sense accuracy in down-mode may be achieved, which can increase the transition performance between boost-mode and down-mode.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A current measurement linearization circuit for a DC/DC boost converter, the current measurement linearization circuit comprising:
    a back-gate sensing transistor having a first terminal adapted to be coupled to a first body contact of a high-side power transistor and a second terminal adapted to be coupled to a second body contact of a first replica transistor in a valley-current sensing circuit; and
    a back-gate reset transistor having a first terminal adapted to be coupled to a max reference voltage that is equal to the greater of an input voltage and an output voltage and a second terminal adapted to be coupled to the second body contact.

2. The current measurement linearization circuit as recited in claim 1 in which during a down-mode, the back-gate sensing transistor is coupled to be turned off when the low-side power transistor is turned on and to be turned on when the low-side power transistor is turned off.

3. The current measurement linearization circuit as recited in claim 2 in which during the down-mode, the back-gate reset transistor is coupled to be turned on when the low-side power transistor is turned on and to be turned off when the low-side power transistor is turned off.

4. The current measurement linearization circuit as recited in claim 3 in which during a boost-mode, the back-gate sensing transistor is coupled to be turned on and the back-gate reset transistor is coupled to be turned off.

5. The current measurement linearization circuit as recited in claim 4 in which the first terminal of the back-gate sensing transistor is further coupled to a third body contact of a back-gate disconnect transistor.

6. The current measurement linearization circuit as recited in claim 5 in which the back-gate sensing transistor and back-gate reset transistor are P-type metal oxide silicon (PMOS) transistors.

7. An integrated circuit (IC) chip, the DC/DC boost converter comprising:
   a first pin, a second pin and a third pin;
   a low-side power transistor and a high-side power transistor coupled in series between the first pin and the second pin, the high-side power transistor having a first body contact;
   a switch-node between the low-side power transistor and the high-side power transistor, the switch node being coupled to the third pin;
   a back-gate disconnect transistor coupled between the first body contact of the high-side power transistor and the second pin;
   a valley-current sensing circuit including:
      a comparator having an inverting input, a non-inverting input, and an output,
      a first replica transistor that is coupled in series with a first current sink between the switch-node and a lower rail, the first replica transistor having a second body contact,
      a first node between the first replica transistor and the first current sink, the first node being coupled to the inverting input of the comparator, and
      a second replica transistor that is coupled in series with a second current sink between a max reference voltage input and the lower rail,
      a second node between the second replica transistor and the second current sink, the second node being coupled to the non-inverting input of the comparator; and
   a current measurement linearization circuit including:
      a back-gate sensing transistor that is coupled between the first body contact and the second body contact of the first replica transistor, and
      a back-gate reset transistor that is coupled between the second body contact and the max reference voltage input.

8. The DC/DC boost converter as recited in claim 7 in which during a down-mode, the back-gate sensing transistor is coupled to be turned off when the low-side power transistor is turned on and to be turned on when the low-side power transistor is turned off.

9. The DC/DC boost converter as recited in claim 8 in which during the down-mode, the back-gate reset transistor is coupled to be turned on when the low-side power transistor is turned on and to be turned off when the low-side power transistor is turned off.

10. The DC/DC boost converter as recited in claim 9 in which during a boost-mode, the back-gate sensing transistor is coupled to be turned on and the back-gate reset transistor is coupled to be turned off.

11. The DC/DC boost converter as recited in claim 10 in which a first terminal of the back-gate sensing transistor is further coupled to a third body contact of a back-gate disconnect transistor.

12. The DC/DC boost converter as recited in claim 11 in which the third body contact of the back-gate disconnect transistor is coupled to the first body contact of the high-side power transistor.

13. The DC/DC boost converter as recited in claim 12 in which an output of the comparator is coupled to initiate turning on the low-side power transistor.

14. The DC/DC boost converter as recited in claim 13 in which the output of the comparator is further coupled to initiate turning off the high-side power transistor.

15. The DC/DC boost converter as recited in claim 12 in which the max reference voltage is equal to an output voltage during boost-mode and is equal to an input voltage during a down-mode.

16. The DC/DC boost converter as recited in claim 12 in which the high-side power transistor, the back-gate disconnect transistor, the first replica transistor, the second replica transistor, the back-gate sensing transistor and the back-gate reset transistor are each P-type metal oxide silicon transistors.

17. A method of operating a DC/DC boost converter, the converter including:
   a low-side power transistor and a high-side power transistor coupled in series between a first pin and a second pin, the high-side power transistor having a first body contact,
   a switch-node between the low-side power transistor and the high-side power transistor, the switch node being coupled to a third pin,
   a first replica transistor coupled between the switch node and a first current source, the first replica transistor having a second body contact
   a second replica transistor coupled between a max voltage input and a second current source, the method comprising:
   during a boost-mode connecting the first body contact of the high-side power transistor and the second body contact of the first replica transistor together and
   during a down-mode when the low-side power transistor is off connecting the first body contact and the second body contact together and
   during the down-mode when the low-side power transistor is on disconnecting the first body contact and the second body contact and coupling the second body contact to a max reference voltage that is equal to a larger one of an input voltage and an output voltage.

18. The method as recited in claim 17 including providing a back-gate disconnect transistor coupled between the high-side power transistor and the second pin.

19. The method as recited in claim 18 including providing a back-gate reset transistor coupled between the second body contact and the max reference voltage and a back-gate sensing transistor having a first terminal coupled to the first body contact and to a third body contact of the back-gate disconnect transistor and a second terminal coupled to the second body contact.

\* \* \* \* \*